United States Patent [19]

Sakakibara et al.

[11] Patent Number: 4,723,251
[45] Date of Patent: Feb. 2, 1988

[54] SEMICONDUCTOR LASER HAVING AN ACTIVE LAYER BURIED IN A GROOVE

[75] Inventors: Yasushi Sakakibara; Hirofumi Namizaki; Etsuji Oomura; Hideyo Higuchi, all of Hyogo, Japan

[73] Assignee: Mitsubishi Denki Kabushiki Kaisha, Tokyo, Japan

[21] Appl. No.: 791,050

[22] Filed: Oct. 24, 1985

[30] Foreign Application Priority Data

Oct. 24, 1984 [JP] Japan ................................ 59-224802

[51] Int. Cl.⁴ ................................................. H01S 3/19
[52] U.S. Cl. ........................................ 372/46; 357/17; 372/48
[58] Field of Search ................. 372/46, 48, 45; 357/17

[56] References Cited

U.S. PATENT DOCUMENTS 4,317,085 2/1982 Burnham et al. ..................... 372/50

Primary Examiner—James W. Davie
Attorney, Agent, or Firm—Sughrue, Mion, zinn, Macpeak, and Seas

[57] ABSTRACT

A semiconductor laser device in which the thickness and position of an active layer grown in a groove are made more controllable. The inventive device includes a buffer layer of a first conductivity type formed on a semiconductor substrate of the same conductivity type, a first current blocking layer of a second conductivity type formed over the first buffer layer, the aforementioned groove being formed through the first and current blocking layer to the buffer layer, the active layer buried in the groove, and mesas formed on both side of the groove. With this structure, during crystal growth of the active layer, atoms which would otherwise diffuse into the groove and make it difficult to control the thickness and position of the active layer diffuse into portions outside the mesas and grow thereon.

5 Claims, 4 Drawing Figures

SEMICONDUCTOR LASER HAVING AN ACTIVE LAYER BURIED IN A GROOVE

BACKGROUND OF THE INVENTION

The present invention relates to a semiconductor laser having an active layer buried in a groove.

FIG. 1 shows, in cross section, an example of a conventional semiconductor laser of this type. In FIG. 1, reference numeral 1 depicts an n type InP substrate, 2 an n type InP buffer layer, 3 a p type InP current blocking layer, 4 an n type InP current blocking layer, 5 an n type InP cladding layer, 6 an InGaAsP active layer, 7 a p type InP cladding layer, 8 a p type InGaAsP contact layer, 9 a p side electrode, and 10 an n side electrode.

The n type InP and p type InP current blocking layers 4 and 3 are arranged on opposite sides of the InGaAsP active layer 6, the latter having a width of about 2 microns. The laser becomes operative when a forward bias voltage is applied across the p side electrode 9 and the n side electrode 10. Since, in this case, a boundary region between the n type InP current blocking layer 4 and the p type InP current blocking layer 3 becomes a p-n reversely biased junction, the injection current to the laser is concentrated in the InGaAsP active layer 6 in a groove 11; the amount of leakage current flowing through regions other than the active layer 6 is minor. As a result, it is possible to obtain oscillation with a threshold current value of 20 mA or less. Further, since the thickness of the InGaAsP active layer 6, measured at the center of the crescent-shaped region in FIG. 1, is on the order of 0.1 to 0.15 microns, and the InGaAsP active layer 6 is surrounded by InP crystals of a refractive index lower than that of the active layer 6, a waveguide is formed integrally therewith, whereby a stable fundamental transverse mode operation is realized.

In the conventional semiconductor laser described above, however, atoms of crystals grown on the flat portion around the groove 11 tend to diffuse towards the interior of the groove 11 when the n type InP cladding layer 5, the InGaAsP active layer 6, and the p type InP cladding layer 7, etc., are grown by liquid phase epitaxy. Therefore, the crystal growth speed is generally higher in the groove than on the flat portion, and thus it becomes difficult to control the thickness and position of the InGaAsP active layer in the groove, thereby rendering the reproducibility of crystal growth poor.

SUMMARY OF THE INVENTION

An object of the present invention is thus to provide a semiconductor laser having a structure such that control of the thickness and postion of the active layer formed in the groove is performed with an improved reproducibility.

According to the present invention, the above object is achieved by providing narrow mesas on both sides of the groove in which the active layer is formed. With such mesas, atoms of crystals which otherwise would diffuse into the groove diffuse into portions outside the mesas to thereby reduce the crystal growth speed in the groove.

DESCRIPTION OF THE PREFERRED EMBODIMENTS

Figure 2:
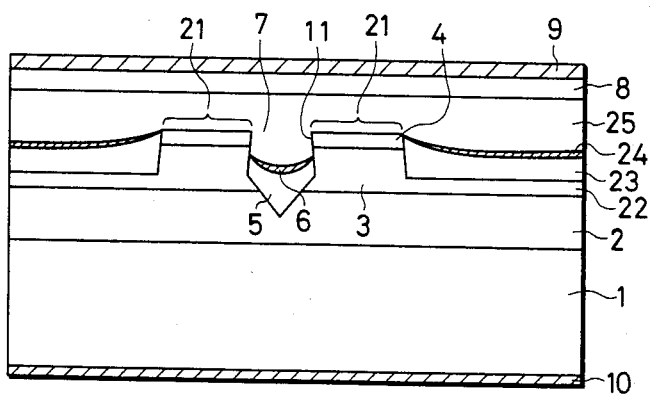
FIG. 2 is a cross section of a preferred embodiment of a semiconductor of the present invention.
Figure 3:
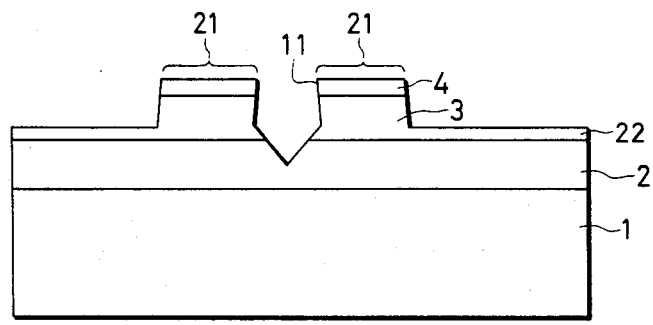
FIG. 3 shows in cross section a mesa structure substrate used for fabrication of the laser of FIG. 2.

FIG. 2 is a cross section of a preferred embodiment of a semiconductor laser according to the present invention, in which reference numeral 21 depicts mesas formed on both sides of a groove 11. The semiconductor laser having this structure may be fabricated by crystal growth, on an n type InP substrate 1, of an n type InP buffer layer 2, a p type InP current blocking layer 3, and an n type InP current blocking layer 4, in the stated order, to thereby form a wafer, etching the wafer to form a substrate having a cross sectional structure as shown in FIG. 3, and growing thereon an n type InP cladding layer 5, an InGaAsP active layer 6, a p type InP cladding layer 7, and a p-InGaAsP contact layer 8, in the stated order, by liquid phase epitaxy.

When the crystal growth on the substrate shown in FIG. 2, having the mesas 21 on both sides of the groove 11, is performed, atoms of crystals grown on the mesas 21 may have a tendency to diffuse toward portions at a lower level than the mesas 21 and grow thereon. However, by selecting the width of each mesa 21 suitably, atoms, which would otherwise diffuse into the groove 11 in the conventional structure shown in FIG. 1, diffuse into portions outside the mesas 21 and grow thereon. The width of the mesa 21 is preferably on the order of 2 to 15 microns. With such a width of the mesas 21, the growth speed of the active layer 6 in the groove is substantially reduced relative to that in the case of the structure shown in FIG. 1, and thus the controllability of the thickness and postion of the active layer 6 is considerably improved. As a result, the reproducibility of the crystal growth is much improved.

Figure 1:
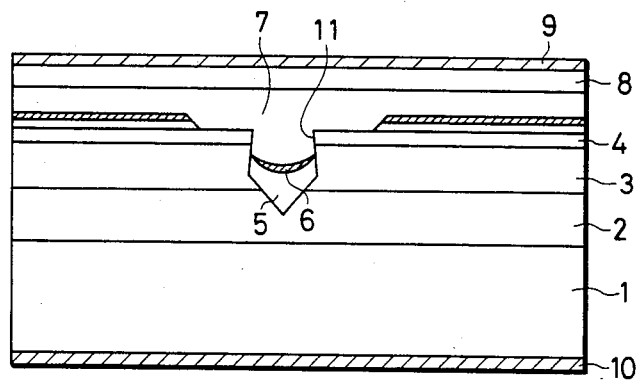
FIG. 1 shows, in cross section, an example of a conventional semiconductor laser.

According to the present invention, an n type InP layer 23, an InGaAsP layer 24 and a p type InP layer 25 are formed, in the stated order, on portions of the p type InP current blocking layer 22 outside the mesas 21 by a second crystal growth step. Therefore, a p-n-p-n current blocking structure is formed in these portions outside the mesas. Accordingly, it is possible to concentrate the injected current in the InGaAsP active layer 6, and thus a similar oscillation characteristics to those of the laser shown in FIG. 1 is obtained.

Figure 4:
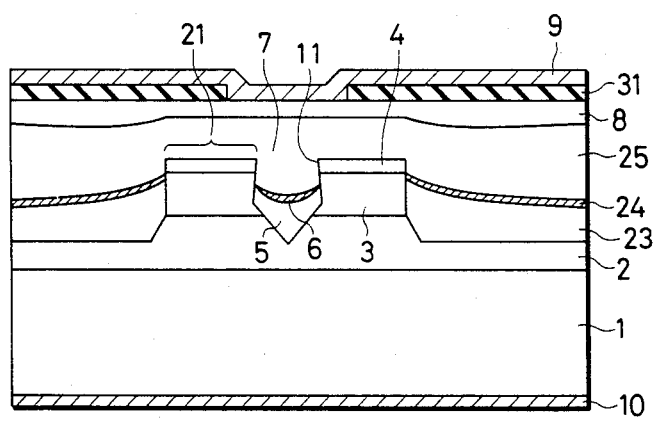
FIG. 4 is a cross section of another embodiment of the present invention.

FIG. 4 shows another embodiment of the present invention, which differs from the embodiment in FIG. 2 in that the portions of the p type InP current blocking layer 22 outside the mesas are removed so that the outer edges of the mesas 21 reach the n type InP buffer layer 2. The laser shown in FIG. 4 is advantageous in that the etching for formation of the mesas 21 is easily controlled, and thus the thickness and position of the active layer are easily controlled. However, since it has no current blocking layers outside the mesas 21, it may be necessary to provide means for concentrating the current in the active layer 6. In the embodiment of FIG. 4, an electrode stripe structure is employed in which as insulating film 31 is arranged between the p type InGaAsP contact layer 8 and the p side electrode 9. The insulating film 31 has an opening corresponding in position to the groove 11. With this structure, the laser oscillation characteristics become similar to those of the structure in FIG. 1 and the reproducibility of the device is improved. For the material of the insulating layer 31 for concentrating the current in the active layer 6, $SiO_2$ or $Si_3N_4$ may be used. Alternatively, it is possible to restrict the current by providing a crystal layer such as an n type InGaAsP layer.

As described above, according to the present invention, narrow mesas are formed on both sides of the groove in which the active layer is buried. With such mesas, the thickness and position of the active layer grown in the groove is made easily controllable, and thus the reproducibility of the device is significantly improved.

We claim:

1. A semiconductor laser comprising: a semiconductor substrate of a first conductivity type, a buffer layer of said first conductivity type formed on said substrate, a first current blocking layer of a second conductivity type formed on said buffer layer, a second current blocking layer of said first conductivity type formed on said first current blocking layer, a groove being formed through said second current blocking layer and said first current blocking layer to said buffer layer, an active layer buried in said groove, a mesa formed on each side of said groove, and means for applying a potential difference across said active layer.

2. The semiconductor laser as claimed in claim 1, wherein said mesa has a width in a range of 2 to 15 microns.

3. The semiconductor laser as claimed in claim 1, wherein said mesas are formed as at least parts of said current blocking layers.

4. The semiconductor laser as claimed in claim 3, wherein portions of said first current blocking layer extend outwardly beyond said mesas.

5. The semiconductor laser as claimed in claim 3, wherein all portions of said first and second current blocking layers outside of said mesas are removed.

* * * * *